(12) United States Patent
Gupta et al.

(10) Patent No.: US 8,174,113 B2
(45) Date of Patent: May 8, 2012

(54) METHODS OF FABRICATING ROBUST INTEGRATED HEAT SPREADER DESIGNS AND STRUCTURES FORMED THEREBY

(75) Inventors: Abhishek Gupta, Chandler, AZ (US); Mike Boyd, Chandler, AZ (US); Carl Deppisch, Chandler, AZ (US); Jinlin Wang, Chandler, AZ (US); Daewoong Suh, Phoenix, AZ (US); Brad Drew, Mesa, AZ (US)

(73) Assignee: Intel Corporation, Santa Clara, CA (US)

( * ) Notice: Subject to any disclaimer, the term of this patent is extended or adjusted under 35 U.S.C. 154(b) by 655 days.

(21) Appl. No.: 12/284,097

(22) Filed: Sep. 17, 2008

(65) Prior Publication Data
US 2010/0065246 A1  Mar. 18, 2010

(51) Int. Cl.
*H01L 23/10* (2006.01)
*H01L 23/34* (2006.01)

(52) U.S. Cl. ........ 257/707; 257/704; 257/713; 257/772; 257/E23.101

(58) Field of Classification Search ............. 257/707, 257/713, 772, E23.101, 704
See application file for complete search history.

(56) References Cited

U.S. PATENT DOCUMENTS

| | | | | |
|---|---|---|---|---|
| 4,872,047 A * | 10/1989 | Fister et al. | ............ | 257/747 |
| 6,656,770 B2 * | 12/2003 | Atwood et al. | ............ | 438/118 |
| 6,724,078 B1 * | 4/2004 | Sur et al. | ............ | 257/704 |
| 6,790,709 B2 * | 9/2004 | Dias et al. | ............ | 438/122 |
| 6,906,413 B2 * | 6/2005 | Bish et al. | ............ | 257/706 |
| 7,183,641 B2 * | 2/2007 | Renavikar et al. | ............ | 257/713 |
| 7,440,281 B2 * | 10/2008 | Bailey et al. | ............ | 361/704 |
| 7,880,298 B2 * | 2/2011 | Drake et al. | ............ | 257/706 |
| 2007/0145546 A1 * | 6/2007 | Lewis et al. | ............ | 257/675 |
| 2007/0166877 A1 * | 7/2007 | Otremba | ............ | 438/106 |
| 2007/0177367 A1 * | 8/2007 | Bailey et al. | ............ | 361/808 |
| 2008/0225490 A1 * | 9/2008 | Suh | ............ | 361/705 |

\* cited by examiner

*Primary Examiner* — Nitin Parekh
(74) *Attorney, Agent, or Firm* — Kathy J. Ortiz

(57) ABSTRACT

Methods and associated structures of forming an indium containing solder material directly on an active region of a copper IHS is enabled. A copper indium containing solder intermetallic is formed on the active region of the IHS. The solder intermetallic improves the solder-TIM integration process for microelectronic packaging applications.

7 Claims, 6 Drawing Sheets

US 8,174,113 B2

METHODS OF FABRICATING ROBUST INTEGRATED HEAT SPREADER DESIGNS AND STRUCTURES FORMED THEREBY

BACKGROUND OF THE INVENTION

Microelectronic devices are typically assembled into packages that are then mounted onto a substrate, such as a printed circuit board (PCB). For central processing unit (CPU) die containing packages, the CPU die may possess higher heat dissipation requirements than other, lower power consuming die that may be present on the substrate, such as memory die, for example. Solder thermal interface material (TIM) may be utilized to attach the dies to an integrated heat spreader (IHS), such as a copper IHS, for example. Gold and nickel have been used on the IHS to prevent the copper of the IHS from diffusing and oxidizing, for example. However, the plating processes of gold and nickel can add significant amount of impurities and porosity in the device, and can cause severe thermal failures in such devices.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE PRESENT INVENTION

Figure 1A:
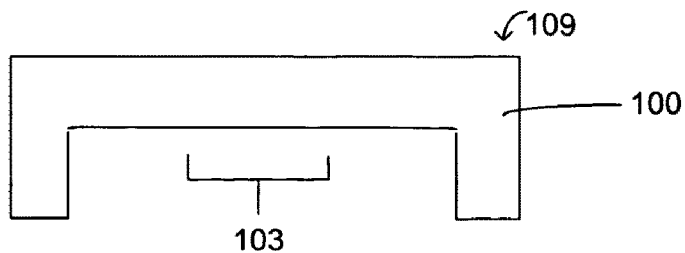
FIGS. 1a-1g represent structures according to embodiments of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Methods and associated apparatus of fabricating microelectronic packages are described. Those methods may comprise forming an indium containing solder material directly on an active region of a copper IHS, and then forming a copper indium containing solder intermetallic on the active region. Methods and apparatus of the present invention serve to form a robust IHS to solder intermetallic, and thus greatly improve the solder-TIM integration process for microelectronic packaging applications, for example.

FIGS. 1a-1g illustrate embodiments of methods and associated structures of fabricating microelectronic package structures according to the present invention. FIG. 1a illustrates a portion of an IHS 100. The IHS 100 may comprise a copper IHS 100, for example. The IHS 100 may comprise a portion of a microelectronic package structure, and may be subsequently joined to a die disposed on a substrate of the microelectronic package structure, to be discussed further herein. The IHS 100 may comprise an active region 103 and a non-active region 109, wherein the active region 103 may comprise a region wherein a microelectronic die may subsequently be attached to the IHS 100. The non-active region 109 may comprise a region wherein the die may not be attached, and wherein a metallic layer, such as a layer of nickel, for example, may be plated onto and/or subsequently formed thereon.

Figure 1B:
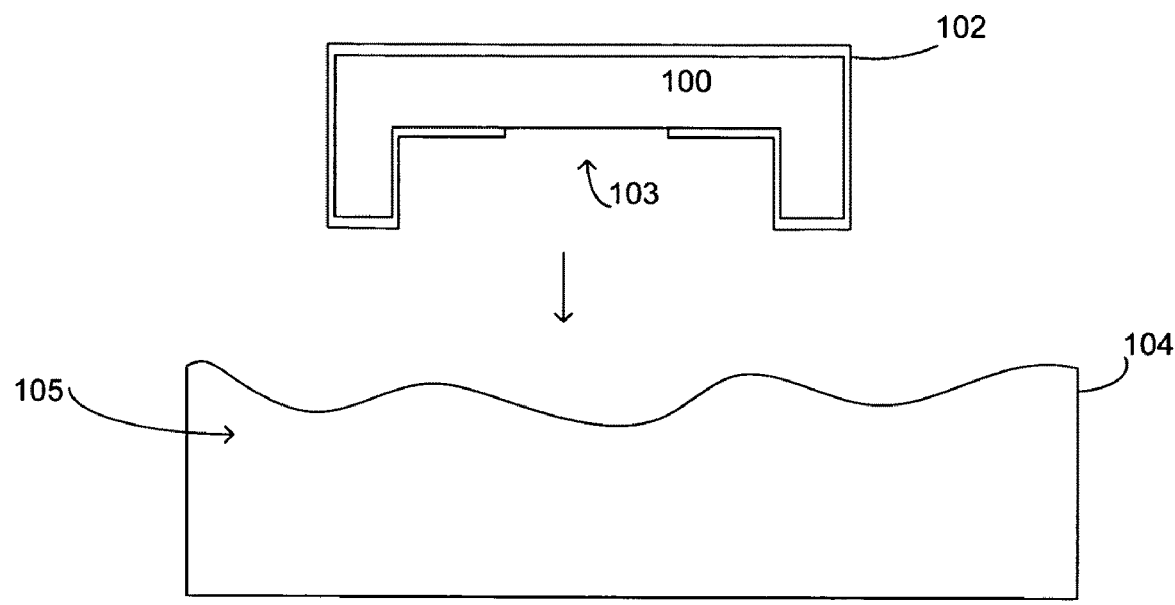

The IHS 100 may be masked with a masking material 102, such as a photoresist material, for example, so that the active region 103 of the IHS 100 is exposed (FIG. 1b). In an embodiment, the masked IHS 100 may be preheated to a temperature of about 160 degrees Celsius and below. In an embodiment, the masked IHS 100 may be placed in an indium containing solder bath 104. The indium containing solder bath 104 may be heated so that the indium containing solder 105 in the solder bath 104 may be in a molten state. The indium containing solder 105 may comprise a reflowable solder material that may act as a protective and bonding layer for the IHS 100. It is desirable to form a reliable thermal interface between the IHS 100 and a die attached by a solder containing TIM, since many failures occur at the interface between the IHS 100 and a TIM.

Figure 1C:
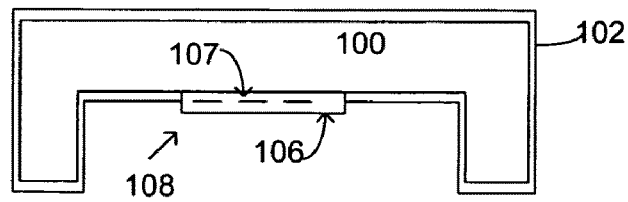
Figure 1D:
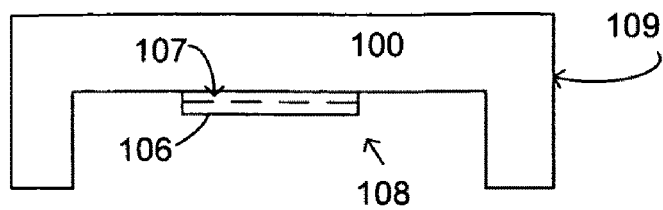
Figure 1E:
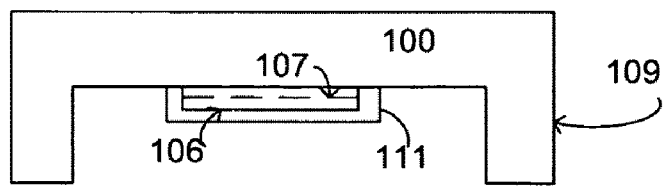

The liquid state indium containing solder 105 may then diffuse at a high temperature into the active region 103 of the copper IHS 100 to form, in some cases immediately, a copper-indium containing solder intermetallic (IMC) 107 on/in the active region 103 of the copper IHS 100. In an embodiment, the IMC 107 may form at the interface between the copper IHS 100 and the indium containing solder 105. The IMC 107 does not form on/in the masked areas of the non-active region 109 of the IHS 100. In an embodiment, a non-IMC indium containing solder layer 106 may be formed on the IMC 107 (FIG. 1c). That is, the indium containing solder 105 may form a solid layer of indium containing solder 108 that may comprise an IMC 107 portion and a non-IMC portion 106 (disposed on the IMC portion 107) on/in the active region 103 of the IHS 100. In an embodiment, the non-IMC portion may serve as a protective layer to prevent the copper IHS 100 from oxidation for increased shelf life.

Figure 4:
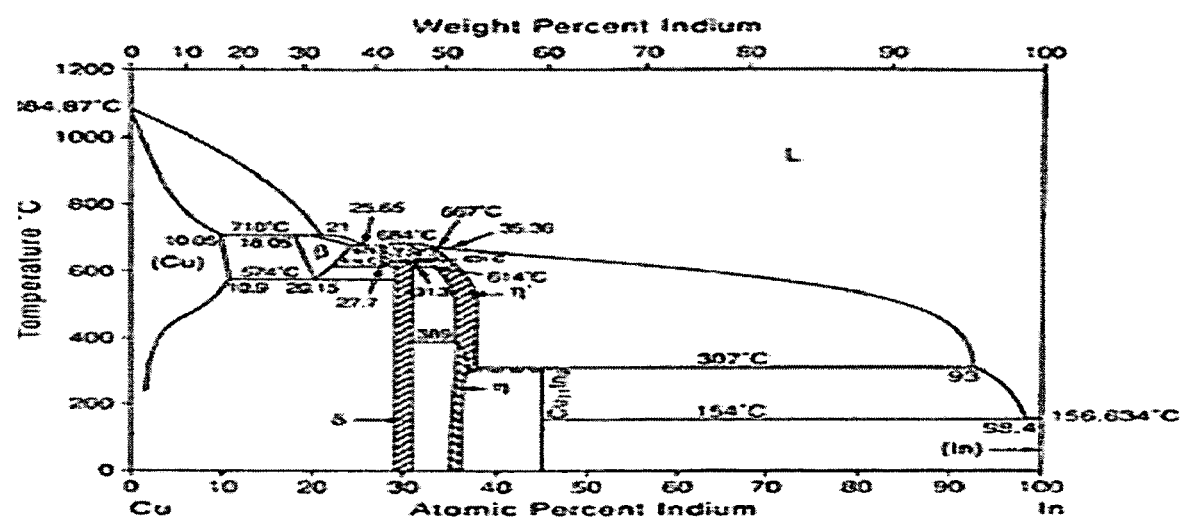
FIG. 4 represents a phase diagram for copper and indium.

In an embodiment, the IMC 107 may comprise at least one of a $Cu_{11}In_3$ intermetallic formed at about 270 degrees Celsius to about 310 degrees Celsius for about 20 minutes to about 40 minutes, and a $Cu_2In$ intermetallic formed at about 340 degrees Celsius to about 380 degrees Celsius for about 5 minutes or less. In another embodiment, the copper indium IMC 107 may be formed below about 600 degrees Celsius. The particular intermetallic that may be formed between the copper IHS 100 and the indium containing solder 105 may depend upon the particular application, and in some applications the IMC 107 may be formed according to a phase diagram of indium and copper (FIG. 4).

Thus, the indium containing solder 105 may form a structurally strong, robust IMC 107 that directly forms between the copper of the IHS 100 and the indium containing solder 105. In contrast, prior art IMC's that may form in the active region of an IHS, such as nickel-gold-indium intermetallics that may be formed, for example, may be structurally weak and may contribute to reliability failures in devices that utilize such prior art IMC's.

Figure 5A:
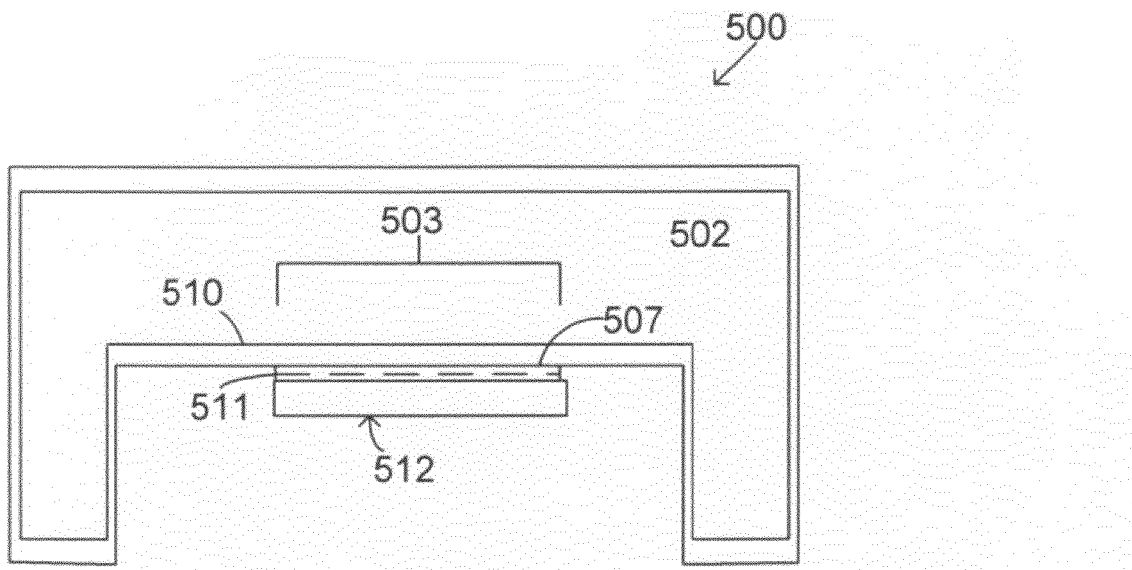
FIGS. 5a-5b represent structures according to the Prior Art.

For example, a prior art IHS structure 500 may comprise a nickel layer 510 that may be disposed on an active region 503 of the IHS 500 (FIG. 5a). The prior art IHS 500 may further comprise a gold layer 511 disposed between the nickel layer 510 and an indium containing solder layer 512. The gold and nickel layers 511, 510 disposed on the IHS 100 have been used to prevent the copper of the IHS 500 from diffusing and oxidizing into the solder, for example. However, the indium containing solder layer 512 tends to react with the nickel and gold during the solder reflow process to form an IMC 507.

Figure 5B:
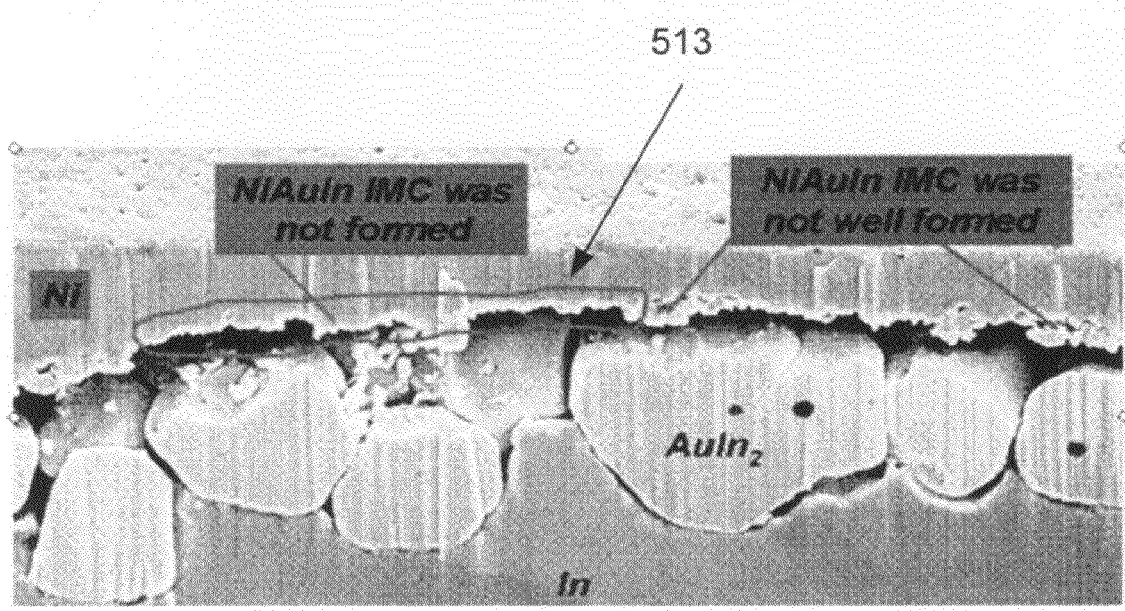

This IMC 507 may comprise gold, nickel and indium in some embodiments, and may be present in the active region 503 of the IHS 500. The prior art IMC 507 may cause deleterious thermal effects for prior art packages using such IHS structures 500, thus contributing to reliability failures. For example, the IMC 507 may cause joint reliability issues such as cracking and delamination 513 of the IHS structure 500 (FIG. 5b), and may affect the integrity of the IHS 500 subsequently attached to a die on a package substrate, in some cases.

The prior art plating processes of nickel and gold layers may also add significant amount of impurities and porosity in these layers, and may cause severe thermal failures in prior art package structures, for example. In contrast, since the indium containing solder of the various embodiments of the present invention may be made to react directly with the copper of the IHS 100, (instead of to the nickel and gold layers of prior art IHS structures) a stronger, more reliable and robust IMC may be formed, that does not comprise nickel and gold, since the nickel is selectively formed to avoid the active region of the IHS of the embodiments of the present invention.

Figure 1F:
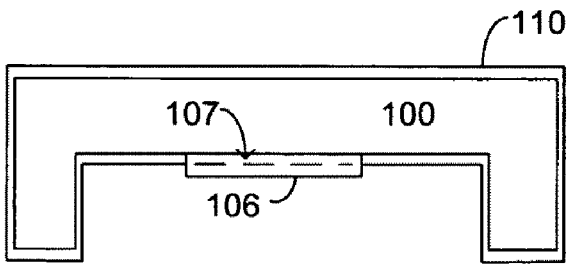

In another embodiment of the present invention, the masking layer 102 of the IHS 100 may be removed to expose the non-active region 109 (referring back to FIG. 1d). The solid layer of indium containing solder 108 that may comprise the IMC 107 and the non-IMC portion 106 may then be masked with a masking material 111 (FIG. 1e) and a metallic layer 110, such as but not limited to nickel, may be formed, by a plating process, for example, on the non-active region 109 of the IHS 100 (FIG. 1f). In another embodiment (not shown), the IHS 100 may be pre-plated/formed with a layer, such as the nickel layer 110, on the non-active region 109 before the IMC 107 is formed on/in the active region of the IHS 100.

Figure 1G:
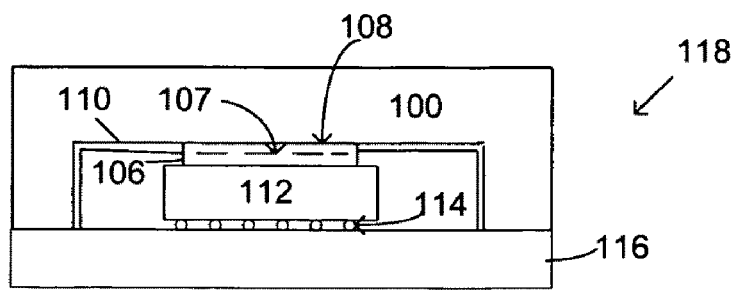

In an embodiment, the IHS 100 comprising the solid layer of indium containing solder 108 that may comprise the IMC 107 and the non-IMC portion 106 may be attached to a die 112 to form a microelectronic package structure 118 (FIG. 1g). The microelectronic package structure 118 may comprise a substrate 116 that may comprise a package structure on a printed circuit board, for example, or may include any such substrate 116 that electrically connects to microelectronic devices, such as that may connect to the die 112.

In an embodiment, the die 112 may comprise a high power consumption die 104. In one embodiment, the high power die 104 may comprise a CPU die 104, for example. The die 112 may be attached to the substrate 116 with an array of interconnect structures 114, which may comprise a ball grid array, for example. In an embodiment, a reflow process may be applied during the IHS 100 attachment process wherein the melting of a portion of the non-IMC 106 indium containing solder and a portion of the nickel layer 110 may form a solid preform during resolidification.

Figure 2A:
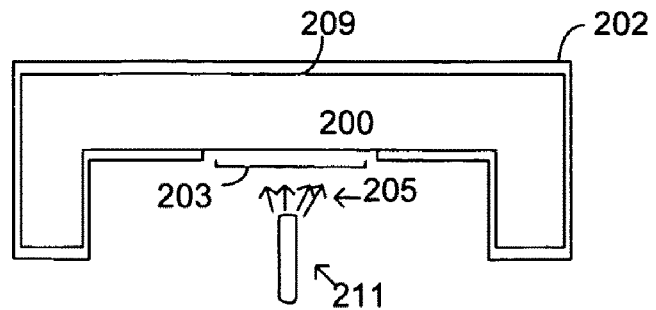
FIGS. 2a-2d represent structures according to embodiments of the present invention.
Figure 2B:
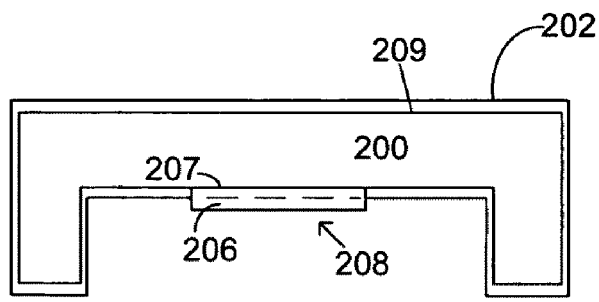

In another embodiment, an IHS 200 may comprise a mask 202 that may cover a non-active region 209 of the IHS 200 and may expose an active region 203 of the IHS 200 (FIG. 2a). A hot indium containing solder 205 may be dispensed 211, using any suitable dispensing technique 211, into/on the active region 203 of the IHS 200. The heated/molten indium containing solder 205 may form a copper-indium containing solder intermetallic (IMC) 207 on/in the active region 203 of the copper IHS 200, similar to the copper-indium containing solder intermetallic (IMC) 107 of FIG. 1c, for example (FIG. 2b).

Figure 2C:
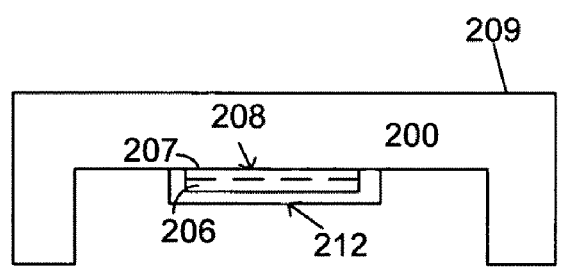
Figure 2D:
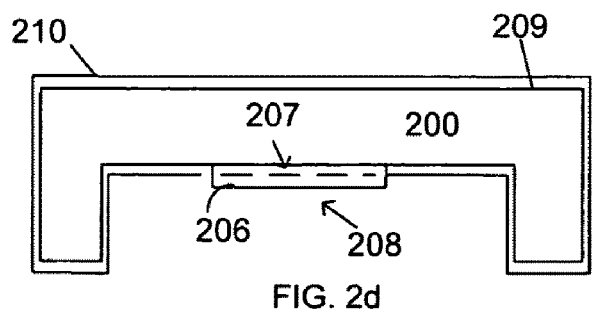

The IMC 207 does not form on/in the masked areas of the non-active region 209 of the IHS 200. The indium containing solder 205 may form a solid layer of indium containing solder 208 that may comprise an IMC 207 portion and a non-IMC portion 206 on/in the active region 203 of the IHS 200. The mask 202 disposed on the non-active region 209 of the IHS 200 may be removed, and then the solid layer of indium containing solder 208 may be masked with a masking material 212 (FIG. 2c). A metallic layer 210, such as a nickel layer for example, may be formed (FIG. 2d) on the non-active region 209. The masking material 212 may be removed, and the IHS 200 comprising the IMC 207 may then be attached on a die in a package substrate, similar to the die and package substrate of FIG. 1g, for example.

Figure 3A:
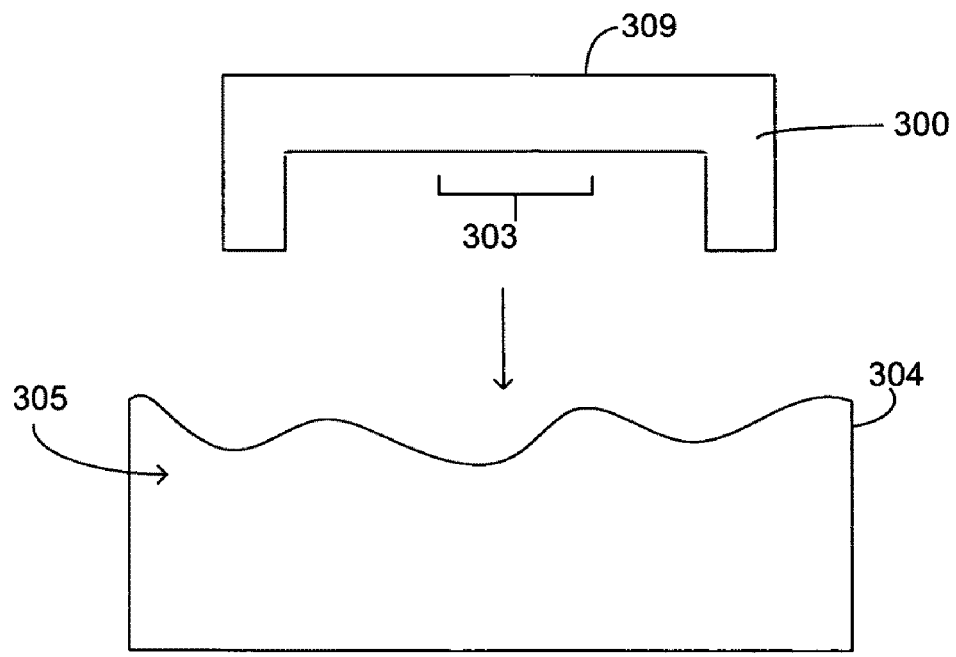
FIGS. 3a-3c represent structures according to embodiments of the present invention.
Figure 3B:
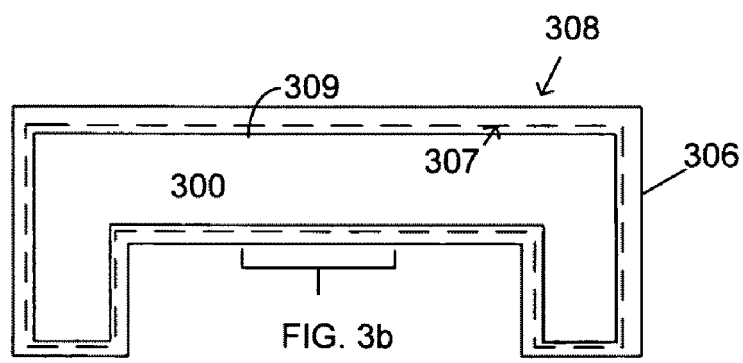

In another embodiment, a bare (unmasked) and oxide free copper IHS 300 may be submerged in a hot liquid indium containing solder bath 304. The heated/molten indium containing solder 305 may form a copper-indium containing solder intermetallic (IMC) 307 on/in the active region 303 of the copper IHS 300, similar to the copper-indium containing solder intermetallic (IMC) 107 of FIG. 1c, for example (FIG. 3b). In addition, the indium containing solder 305 may also be formed on the non-active region 309 of the IHS 300.

Figure 3C:
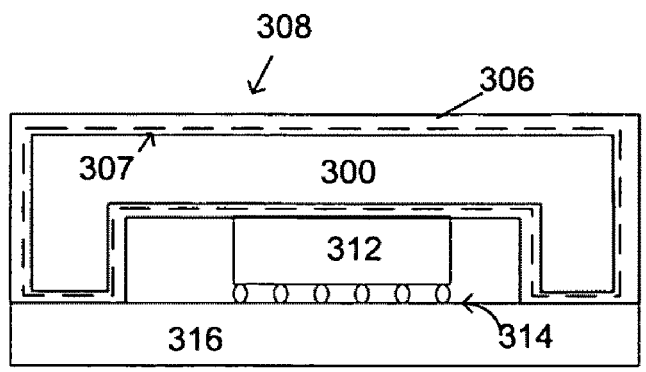

Thus, the indium containing solder 305 may form a solid layer of indium containing solder 308 that may comprise an IMC 307 portion and a non-IMC portion 306, and may be disposed over the active region 303 and the non-active region 309 of the IHS 300. In an embodiment, the portion of the solid layer of indium containing solder 308 that forms over the non-active region 309 of the IHS 300 may function as a thermal interface material (TIM), for a microelectronic package comprising the IHS 300 attached to a die 312 (FIG. 3c), similar to the microelectronic package of FIG. 1g for example. The IHS 300 of the present embodiment may be used for thin die thin TIM applications, for example.

In other embodiments, the indium containing solder can be deposited on the active region of the copper IHS in several other ways such as but not limited to plating, casting, and diffusion bonding processes followed by immediate heating, as long as the process provides a robust copper indium intermetallic formation.

Benefits of the various embodiments of the present invention include enabling the replacement of gold and nickel intermetallics with a reflowable solder material to be used as a protective and bonding layer. The novel and robust copper indium IMC IHS design formed by directly reflowing solder materials in the active region of the IHS enable a robust, reliable solder IMC that greatly improves the solder TIM integration process. Additionally, replacing the gold and nickel regions of the prior art IHS structures provides cost savings to the solder TIM integration process. The use of thinner dies in multi chip packages is enabled.

Although the foregoing description has specified certain steps and materials that may be used in the method of the present invention, those skilled in the art will appreciate that many modifications and substitutions may be made. Accordingly, it is intended that all such modifications, alterations, substitutions and additions be considered to fall within the spirit and scope of the invention as defined by the appended claims. In addition, it is appreciated that a package, such as may be found in a printed circuit board, is well known in the art. Therefore, it is appreciated that the Figures provided herein illustrate only portions of an exemplary package assembly that pertains to the practice of the present invention. Thus the present invention is not limited to the structures described herein.

What is claimed is:

1. A structure comprising:
   a copper IHS; and
   a copper indium containing solder intermetallic disposed on an active region of the copper integrated heat spreader (IHS), wherein the copper indium containing solder intermetallic is directly in contact with the active region of the copper IHS; and
   a solid indium containing solder layer disposed on a non-active region of the copper IHS, wherein the solid indium containing solder layer comprises a thermal interface material (TIM).

2. The structure of claim 1 wherein the copper indium containing solder intermetallic comprises an intermetallic formed below about 600 degrees Celsius.

3. The structure of claim 2 wherein the copper indium containing solder intermetallic comprises at least one of a $Cu_{11}In_3$ intermetallic and a $Cu_2In$ intermetallic.

4. The structure of claim 1 further comprising a nickel layer disposed on a non-active region of the copper IHS.

5. The structure of claim 1 further comprising wherein the active region does not comprise gold and nickel.

6. The structure of claim 1 further comprising wherein the copper IHS is disposed on a die comprising a portion of a microelectronic package.

7. The structure of claim 1 wherein the copper indium containing solder intermetallic further comprising a non-IMC portion disposed on an IMC portion.

* * * * *